United States Patent

Ashby et al.

[11] Patent Number: 5,917,379
[45] Date of Patent: Jun. 29, 1999

[54] BROADBAND LINEAR TRANSCONDUCTANCE AMPLIFIER WITH RESISTIVE POLE-SPLITTING COMPENSATION

[75] Inventors: Kirk B Ashby; Paul C. Davis, both of Reading, Pa.

[73] Assignee: Lucent Technologies Inc., Murray Hill, N.J.

[21] Appl. No.: 08/903,012

[22] Filed: Jul. 31, 1997

[51] Int. Cl.[6] .................................................. H03F 3/45
[52] U.S. Cl. ........................................ 330/260; 330/292
[58] Field of Search .................................. 330/252, 257, 330/260, 292, 294, 209, 203, 85, 282, 86, 109, 103

[56] References Cited

U.S. PATENT DOCUMENTS

| | | | |
|---|---|---|---|
| 3,622,903 | 11/1971 | Steckler | 330/260 |
| 4,157,512 | 6/1979 | Schmoock | 330/260 |
| 5,068,621 | 11/1991 | Hayward et al. | 330/301 |
| 5,307,024 | 4/1994 | Metz et al. | 330/260 |
| 5,392,000 | 2/1995 | Gillig | 330/292 |
| 5,465,070 | 11/1995 | Koyama et al. | 330/260 |

*Primary Examiner*—Robert Pascal
*Assistant Examiner*—Khank Van Nguyen

[57] ABSTRACT

A compensation scheme for differential- or single-input transconductance amplifiers relies on an active feedback path with a resistive pole-splitting compensation circuit. The resistive compensation circuit causes pole-splitting of the two dominant poles, moving one pole to a slightly lower frequency and the other to a much higher frequency compared to the dominant poles of the uncompensated amplifier. A DC-blocking capacitor may also be placed in series with the resistor of the compensation circuit to allow for proper biasing of the circuit. By selecting appropriate values for the passive elements in the compensation circuit, the compensation scheme of the present invention can cause the amplifier to operate in a stable, linear manner over the same or even a larger bandwidth than an equivalent amplifier without compensation. The present invention does not suffer the problems of standard narrowbanding compensation schemes associated with high frequency cut-off.

20 Claims, 8 Drawing Sheets

BROADBAND LINEAR TRANSCONDUCTANCE AMPLIFIER WITH RESISTIVE POLE-SPLITTING COMPENSATION

BACKGROUND OF THE INVENTION

1. Field of the Invention

The present invention relates to electronics, and, in particular, to transconductance amplifiers.

2. Description of the Related Art

A transconductance amplifier is a type of electrical circuit that transforms an input voltage into an output current. Some transconductance amplifiers convert AC input voltages into AC output currents. There are many applications for which it is desirable that the performance of such a transconductance amplifier be linear. That is, the gain provided by the amplifier is substantially constant over a relatively wide range of input voltage amplitudes and frequencies. Transconductance amplifiers often employ feedback to improve linearity. While feedback can improve linearity, it can also create instability which may lead to undesirable oscillation. Potential instability is manifested as "peaking" in a plot of the closed-loop gain versus frequency response. For many applications, peaking greater than about 3 dB is considered to be unacceptable.

FIG. 1 shows a block diagram of a conventional differential-input transconductance amplifier 100 used to convert a differential AC input voltage ($V_{IN1P}$, $V_{IN1N}$) into a differential AC output current ($I_{OUTP}$, $I_{OUTN}$). Amplifier 100 comprises two symmetric half circuits, each half circuit corresponding to a singleinput transconductance amplifier, separated by an impedance device 126 (preferably a resistor). Each half circuit receives one half of the differential input voltage and, in conjunction with the other half circuit and impedance device 126, generates one half of the differential output current.

In particular, current source 102 provides a constant current to node N3. Feedback (provided by feedback device 108) forces the current into input device 104 (preferably a transistor) to be constant and approximately equal to the current provided by current source 102, even if the input voltage $V_{INP}$ applied to the base (or gate) of input device 104 changes. Feedback device 108 adjusts the base (or gate) voltage of output device 106, which is also preferably a transistor. Adjusting the base (or gate) voltage of output device 106 affects the current through output device 106. The current through output device 106 gets mirrored by output mirror 112 as one half (i.e., $I_{OUTP}$) of the differential output current generated by amplifier 100.

The other half circuit of amplifier 100 (i.e., block components 114–124) operate in an analogous fashion, receiving input voltage $V_{IN1N}$ and generating output current $I_{OUTN}$.

Since the current through input device 104 is forced by feedback to be constant, even when an AC signal is applied to the base (or gate) of input device 104, the base-emitter (or gate-source) voltage of input device 104 is also constant. This means that there is a fixed DC voltage drop across input device 104, which, in turn, means that the AC component of input voltage $V_{IN1P}$ is effectively applied directly to node N1. Similarly, for the other half circuit of amplifier 100, the AC component of input voltage $V_{IN1N}$ is effectively applied directly to node N2. As such, the differential AC input signal is applied across impedance device 126.

As described above, the current 10 through input device 104 is substantially constant. The current ΔI through imped-ance device 126 is directly proportional to the differential AC input voltage ΔV, as shown in Equation (1) as follows:

$$\Delta I = \Delta V / Z \qquad (1)$$

where Z is the impedance of device 126. Since the current arriving at node N1 must equal the current leaving node N1, the current through output device 106 is ($I_0 - \Delta I$). This current gets mirrored (and possibly amplified) by output mirror 112 as $I_{OUTP} = k(I_0 - \Delta I)$, where k is the mirror amplification multiplier. Similarly, assuming that the two half circuits of amplifier 100 have the same component characteristics, the current through output device 118 is ($I_0 + \Delta I$), which gets mirrored as $I_{OUTN} = k(I_0 + \Delta I)$ by output mirror 124.

The difference between $I_{OUTN}$ and $I_{OUTP}$ is therefore 2kΔI or, substituting the relation of Equation (1), 2kΔV/Z. As such, amplifier 100 of FIG. 1 can be used to convert a differential input voltage ΔV into a differential output current, that can then be used for further processing (e.g., as a current or as a voltage). For example, passing this differential current through another impedance device Z' will yield a voltage 2kΔVZ'/Z, which is directly proportional to the original differential input voltage ΔV.

One of the drawbacks of amplifiers such as amplifier 100 of FIG. 1 is that they may become unstable at high frequencies. The reason for this may be understood by analyzing a simplified, small-signal equivalent circuit of amplifier 100, such as that shown in FIG. 2. In this simplified circuit, resistor R1 and capacitor C1 represent the equivalent impedance at node N1 of FIG. 1. Similarly, resistor R2 and capacitor C2 represent the equivalent impedance at node N3 of FIG. 1, and resistor R3 and capacitor C3 represent the equivalent impedance at node N5 of FIG. 1. The transconductances of input device 104, feedback device 108, and output device 106 of FIG. 1 are represented by gm1, gm2, and GM3, respectively. Since output mirror 112 of FIG. 1 does not affect the feedback loop dynamics except for effects included in R3 and C3, it has been left out of the simplified circuit of FIG. 2.

Using feedback theory, the open-loop gain (defined to be the total gain around the feedback loop) of the circuit can be used to look for potential instabilities. To do this, the feedback loop is broken at an appropriate point and the gain from the input to the output is found. For the simplified circuit of FIG. 2, it is convenient to break the loop at node 4, apply a current as a stimulus, and determine the resulting output current. The open-loop gain is defined to be the ratio of the output current to the input current. The current gain magnitude (in dB) and the phase (in degrees) are plotted as a function of frequency.

If the total phase shift around the loop is equal to 360 degrees at a point where the gain is still greater than unity, oscillation will occur at that frequency. The difference between 360 and the actual phase shift around the loop at the frequency where the gain is unity is known as the phase margin. As phase margin decreases, the previously mentioned peaking will be observed in the closed-loop response. Phase margin of less than 45 degrees is typically undesirable, and, in some application, phase margin of 60 degrees or more may be required. Because negative feedback is employed, a minimum of 180 degrees of phase shift is present. Each pole in the gain response causes the gain to roll off by 20 dB/decade (6 dB/octave), and contributes 90 degrees of additional phase shift. For the simplified circuit of FIG. 2, poles are found at $\omega 1 = 1/(R1C1)$, $\omega 2 = 1/[C2/(gm2+1/R2)]$, and $\omega 3 = 1/(R3C3)$.

Substitution of appropriate values for actual devices reveals that the pole at $\omega 1$ is at a very high frequency and that the loop response is dominated by the poles at ω2 and ω3. Simulations of circuits also show that the poles at ω2 and ω3 may be closely spaced in frequency. This narrow spacing causes potential instabilities. This is illustrated in the open-loop gain and phase response curves shown in FIG. 3 for the uncompensated amplifier. Each pole contributes a total of 90 degrees of phase shift. Since they are spaced closely together, the 180-degree phase shift added by these two poles occurs in a relatively narrow frequency band, and the phase shift around the loop can reach 360 degrees before the gain drops below unity. This can result in poor phase margin and therefore possible oscillations.

One common known solution to this instability problem is to reduce the bandwidth of the amplifier (often called narrowbanding). Adding a capacitor between nodes N3 and N4 in FIG. I will accomplish this narrowbanding compensation.

FIG. 4 shows a block diagram of a differential-input transconductance amplifier 200 to which standard narrowbanding compensation has been added. Amplifier 200 is analogous to amplifier 100 (with block components 202–226 of FIG. 2 corresponding to block components 102–126 of FIG. 1), except that a capacitor C has been added between nodes N3 and N4 to provide compensation. The increased capacitance causes one of the two dominant poles to move to a much lower frequency. This reduces the unity-gain frequency of the open-loop response to a frequency where the phase margin is sufficient to ensure stability.

Adding a capacitor C between nodes N3 and N4 is equivalent to increasing the capacitance C2 in the simplified equivalent circuit of FIG. 2 and reduces the frequency of one of the dominant poles. Increasing the equivalent capacitance of C3 will have a similar narrowbanding compensation effect. Narrowbanding solves the instability problem by moving one of the poles to a much lower frequency as illustrated in the open-loop gain and phase response curves of FIG. 3 for the narrowband-compensated amplifier. With narrowband compensation, the gain is rolled off to below unity at a frequency below the frequency where the phase shift of the second pole takes affect. While this guarantees that the amplifier will not oscillate, it also greatly limits the frequency of operation.

Another possible solution to the stability problem is to reduce the loop gain. This solves the stability problem by reducing the unity-gain frequency of the open-loop response. Since the pole locations do not have to be affected by such a change, the net result is an improvement in phase margin. However, one of the purposes of using feedback in a transconductance amplifier is to improve linearity. The improvement in linearity is a function of the magnitude of the open-loop gain. Increased gain results in improved linearity. Since linearity is important in many applications of transconductance amplifiers, it is undesirable to reduce the open-loop gain even though such a reduction may solve a stability problem.

What is needed is a compensation scheme that addresses the instability problems of an uncompensated amplifier without unreasonably limiting the range of frequencies over which the amplifier will operate linearly.

SUMMARY OF THE INVENTION

Rather than moving one of the two dominant poles to a lower frequency or reducing the openloop gain, a more desirable solution to the compensation problem would be to move one of the poles to a higher frequency. This will solve the instability problem just as the narrowbanding approach does, but the closed-loop frequency response of the amplifier will not be degraded, since the unity-gain frequency of the open-loop response will still be at a high frequency and may even be higher than it was before compensation. In practice, it is difficult to move one of the poles without affecting the other.

A compromise is to use a compensation technique known as pole-splitting that moves one of the poles to a higher frequency, while moving the other pole to a lower frequency than its location prior to compensation. If the lower-frequency pole is kept at a frequency higher than the low-frequency pole of narrowband compensation, this will have the benefits of the broadbanding compensation approach while minimizing the undesirable effects of narrowband compensation.

The present invention can be implemented as an integrated circuit having a transconductance amplifier, the amplifier comprising an active feedback device and a passive compensation circuit, connected in parallel with the active feedback device. According to embodiments of the present invention, the compensation scheme for differential- or single-input transconductance amplifiers relies on an active feedback path with a resistive pole-splitting compensation circuit. The resistive compensation circuit causes pole-splitting of the two dominant poles, moving one pole to a slightly lower frequency and the other to a much higher frequency compared to the dominant poles of the uncompensated amplifier. A DC-blocking capacitor may also be placed in series with the resistor of the compensation circuit to allow for proper biasing of the circuit. By selecting appropriate values for the passive elements in the compensation circuit, the compensation scheme of the present invention can cause the amplifier to operate in a stable, linear manner over the same or even a larger bandwidth than an equivalent amplifier without compensation. The present invention does not suffer the problems of standard narrowbanding compensation schemes associated with high frequency cut-off.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention is directed to a compensation scheme for transconductance amplifiers that rely on feedback signals to maintain amplifier stability and linearity over its range of operating frequencies. According to embodiments of the present invention, a broadband compensation method is employed that moves one dominant pole of the open-loop gain to a higher frequency while minimally reducing the frequency of a second dominant pole. This results in a stable, high-frequency transconductance amplifier. In one possible embodiment, the compensation is accomplished by placing a resistor in parallel with the active feedback device.

Figure 7:
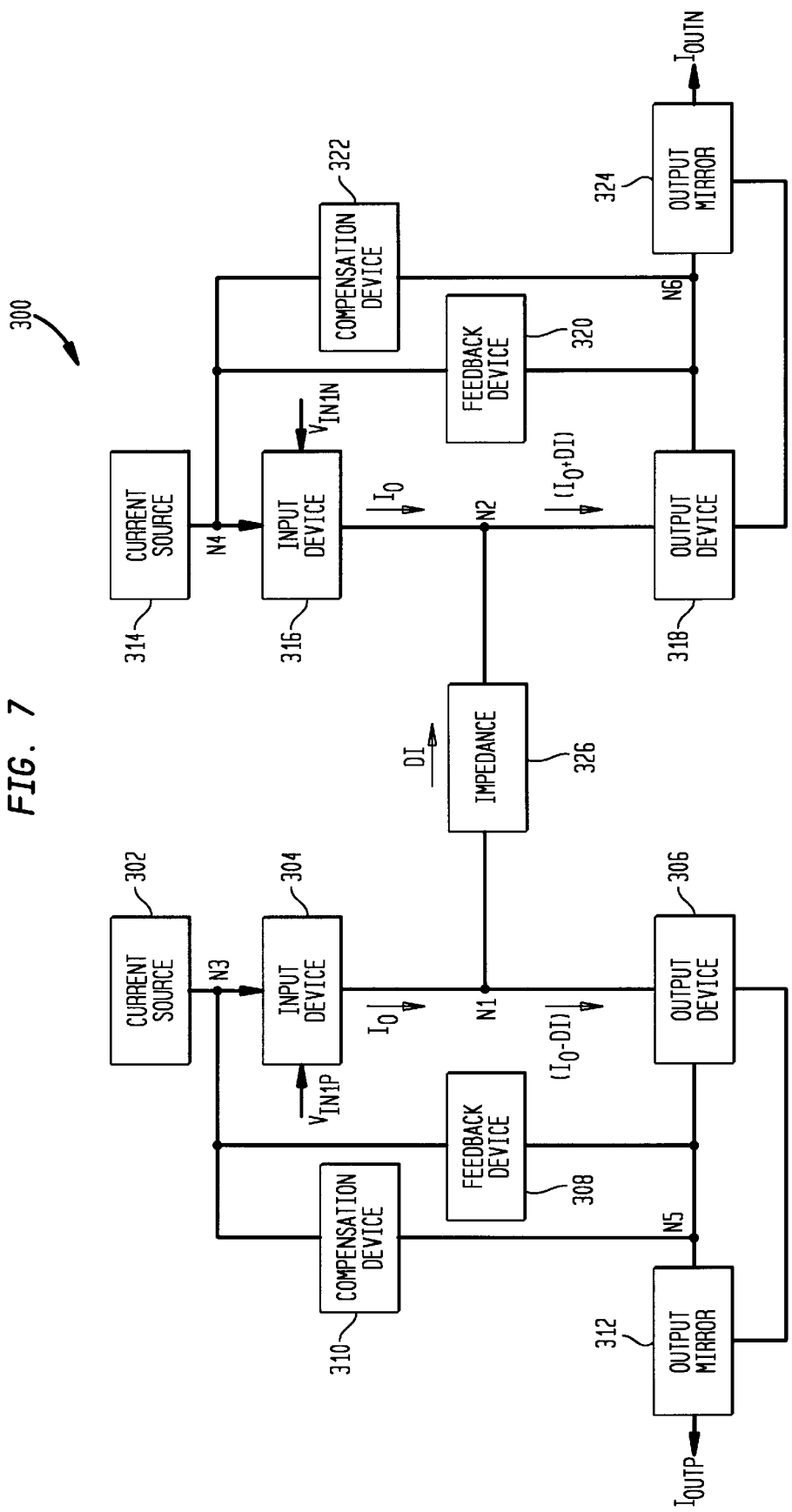
FIG. 7 shows a block diagram of a differential-input transconductance amplifier, according to one embodiment of the present invention.

FIG. 7 shows a block diagram of a differential-input transconductance amplifier 300, according to one embodiment of the present invention. Amplifier 300 is analogous to amplifier 100 of FIG. 1, except that resistive pole-splitting compensation circuits 310 and 322 have been added in parallel with feedback devices 308 and 320. Compensation circuits 310 and 322 provide passive feedback paths, while feedback devices 308 and 320, preferably transistors, provide active feedback paths for the amplifier. Each of compensation circuits 310 and 322 preferably comprises a capacitor connected in series with the resistor. For biasing reasons, the capacitor is added to block DC signals while allowing compensation of AC signals to be accomplished.

Figure 8:
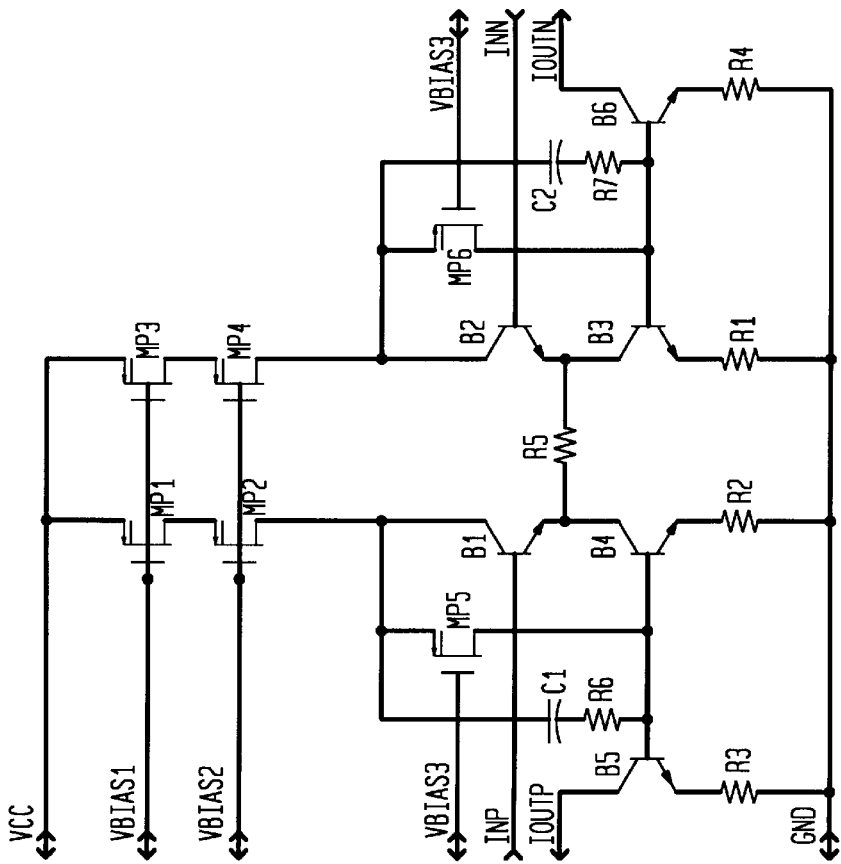
FIG. 8 shows a schematic diagram of one possible implementation of the amplifier of FIG. 7.

FIG. 8 shows a schematic diagram of one possible implementation of amplifier 300 of FIG. 7. The following table relates the circuit elements of FIG. 8 to the block components of FIG. 7:

| CORRELATION BETWEEN BLOCK COMPONENTS OF FIG. 8 AND CIRCUIT ELEMENTS OF FIG. 7 | |
|---|---|
| Block Component | Circuit Element(s) |
| 302 | MP1, MP2 |
| 304 | B1 |
| 306 | B4, R2 |
| 308 | MP5 |
| 310 | C1, R6 |
| 312 | B5, R3 |
| 314 | MP3, MP4 |
| 316 | B2 |
| 318 | B3, R1 |
| 320 | MP6 |
| 322 | C2, R7 |
| 324 | N6, R4 |
| 326 | R5 |

In the implementation of FIG. 8, transistor MP5 provides the active feedback path of feedback device 308 of FIG. 7, while DC-blocking capacitor C1 in series with resistor R6 provide the passive feedback path of compensation circuit 322. Similarly, MP6 provides the active feedback path of feedback device 320 of FIG. 7, while DC-blocking capacitor C2 in series with resistor R7 provide the passive feedback path of compensation circuit 322. Capacitors C1 and C2 are used to block the resistive feedback at DC to allow for proper biasing of the circuit.

Figure 2:
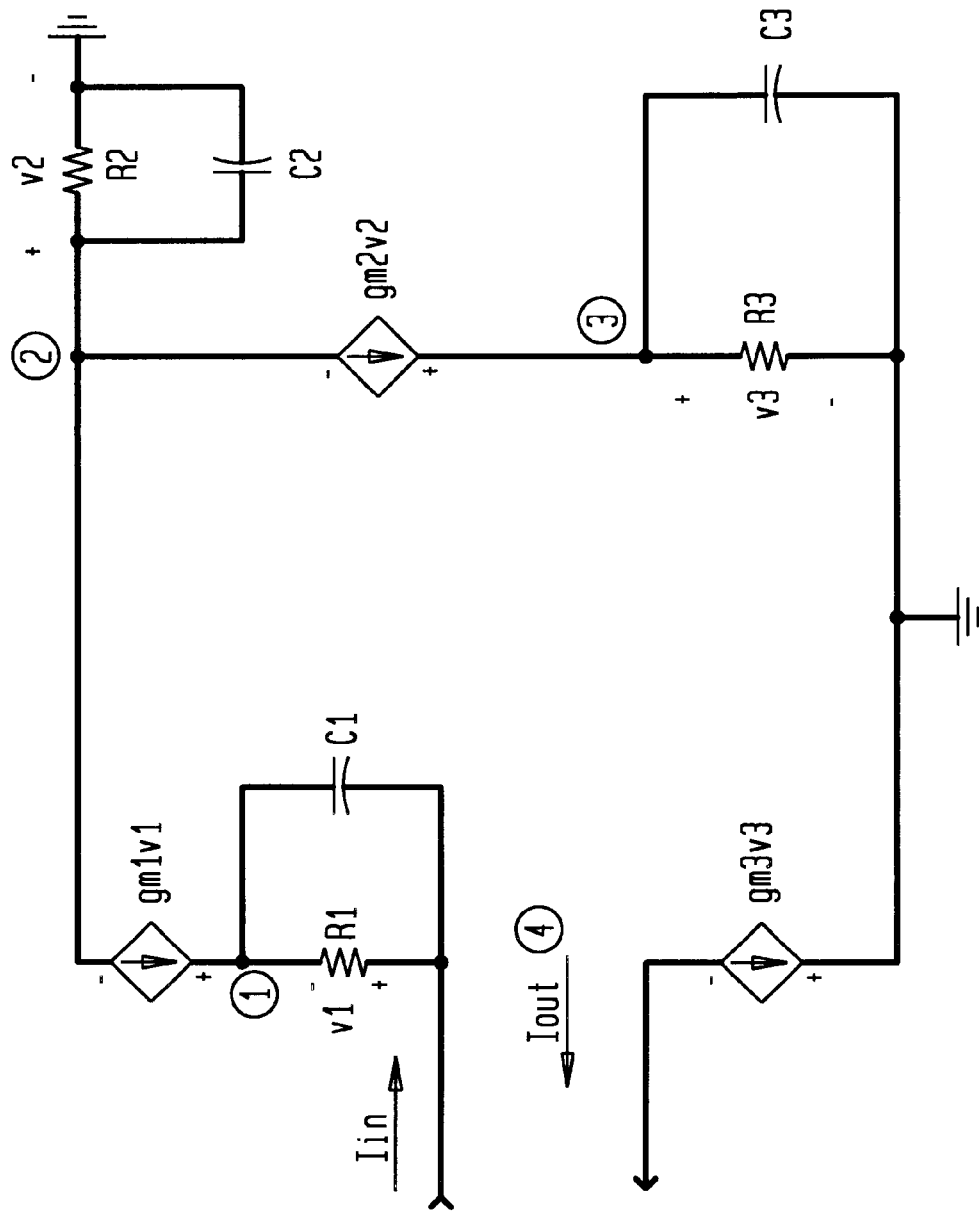
FIG. 2 shows a simplified schematic diagram of a conventional transconductance amplifier that is used for conceptual analysis.
Figure 9:
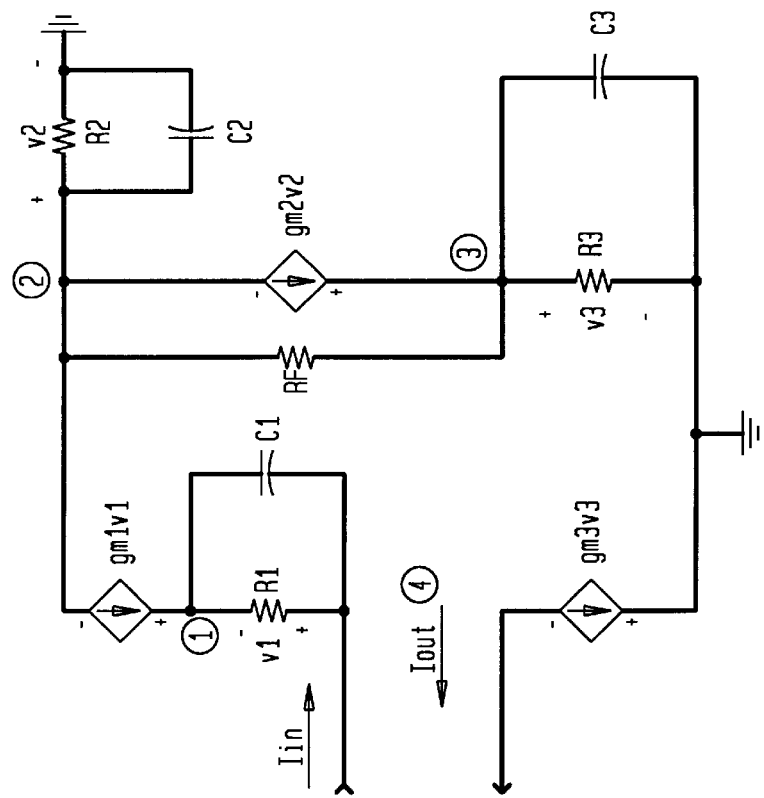
FIG. 9 shows a schematic diagram of a simplified transconductance amplifier used for conceptual analysis.

FIG. 9 shows a schematic diagram of a simplified, small-signal equivalent circuit for amplifier 300 of FIGS. 7 and 8. Analysis of the simplified circuit of FIG. 9 shows that the compensation scheme of the present invention accomplishes the desired movement of poles to achieve stability without compromising bandwidth. The component values of FIG. 9 are defined in the same way as they were for the simplified circuit of FIG. 2. With the compensation resistor RF, the dominant poles, ω2 and ω3, are given by the following equation:

$$\omega_{2,3} = \frac{1}{2}\left[\frac{1}{\frac{1}{C2}\left(gm2 + \frac{1}{R2} + \frac{1}{RF}\right) + \frac{1}{C3}\left(\frac{1}{R3} + \frac{1}{RF}\right)} \pm \right.$$

$$\left. \sqrt{\left(\frac{1}{\frac{1}{C2}\left(gm2 + \frac{1}{R2} + \frac{1}{RF}\right) + \frac{1}{C3}\left(\frac{1}{R3} + \frac{1}{RF}\right)}\right)^2 - \frac{4}{\frac{1}{C2C3}\left(\frac{1}{R2R3} + \frac{gm2}{R3} + \frac{1}{R2RF}\right)}}\right]$$

Figure 3:
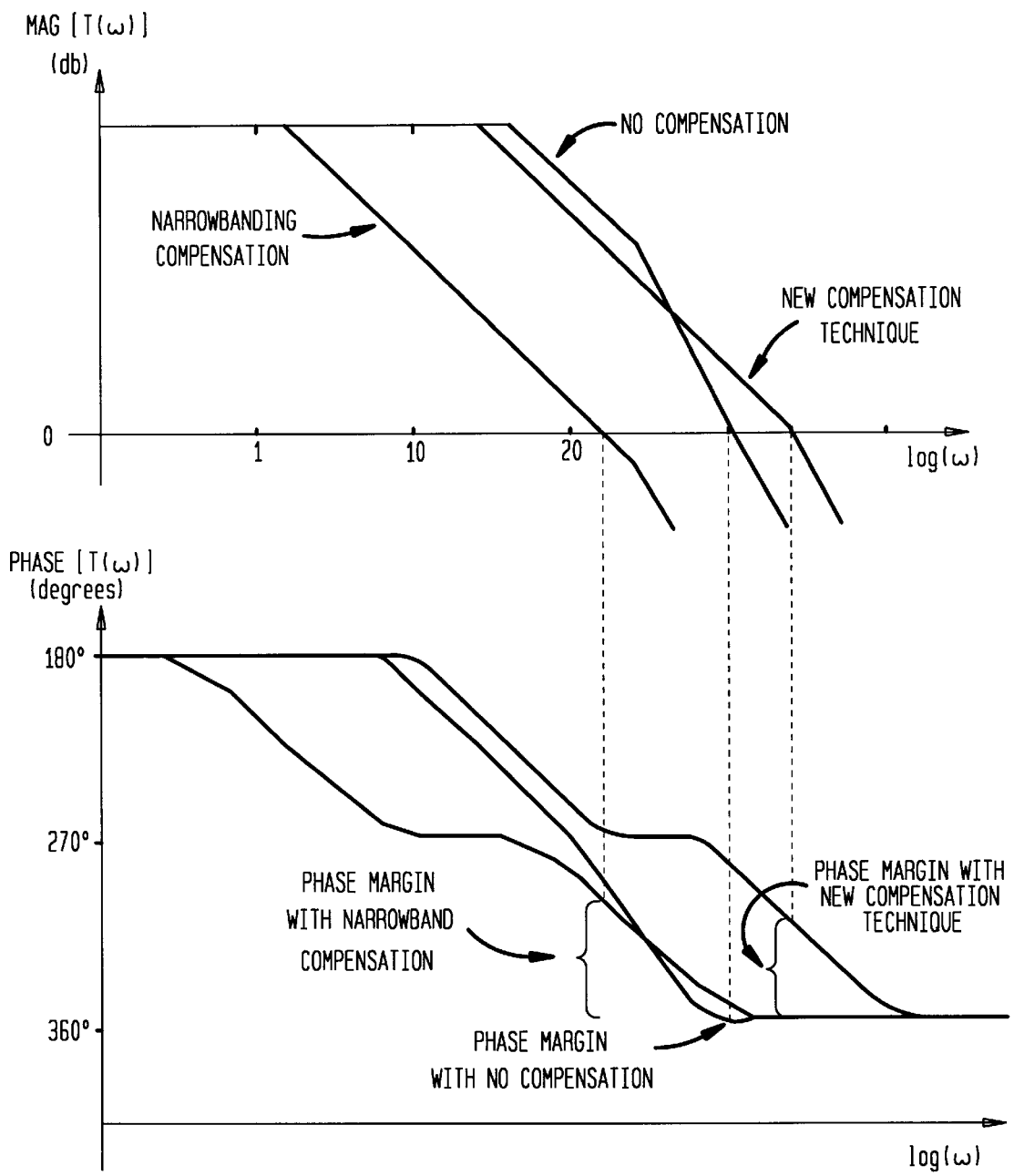
FIG. 3 shows a graphical representation of conceptual open-loop gain and phase response curves for simplified, small-signal equivalent circuits illustrating operation without compensation, with narrowband compensation, and with resistive pole-splitting compensation according to the present invention.

Simulations show that the circuit is relatively insensitive to the value of C1 as long as it is large compared to the values for C2 and C3 as defined for the simplified circuit of FIG. 9. This concept is illustrated in the open-loop gain and phase response curves of FIG. 3 for a simplified amplifier with the compensation technique of the present invention.

Figure 5A:
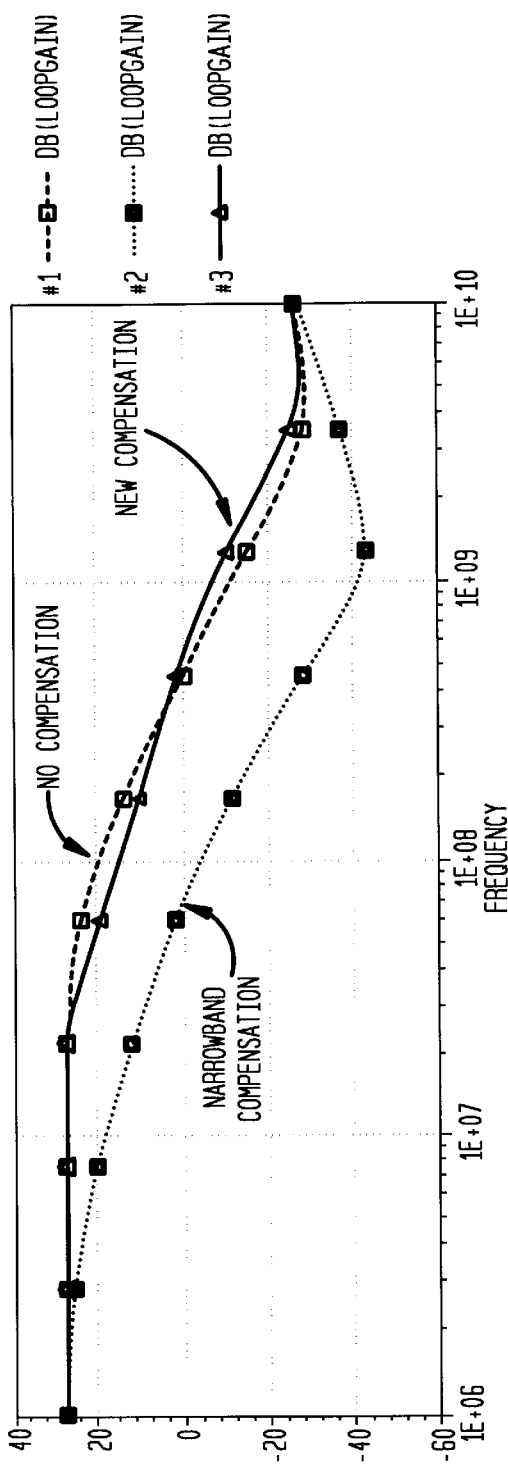
FIGS. 5a–b shows a graphical representation of simulated open-loop gain and phase response curves for non-simplified circuits illustrating operation without compensation, with narrowband compensation, and with resistive pole-splitting compensation according to the present invention.
Figure 5B:
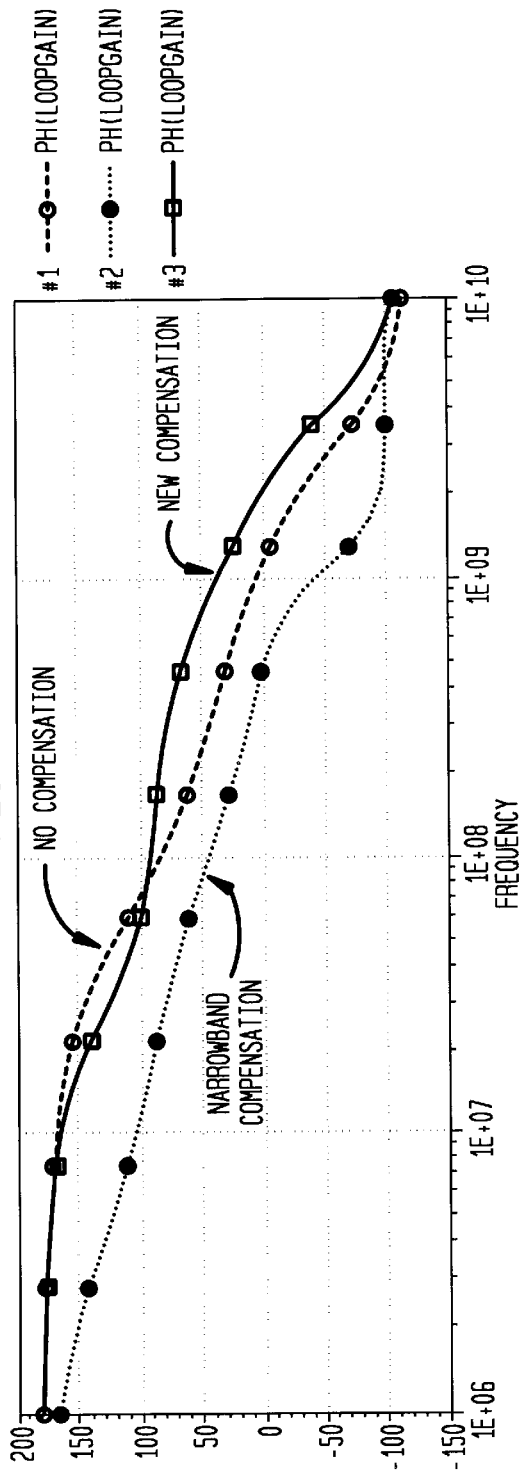
Figure 6:
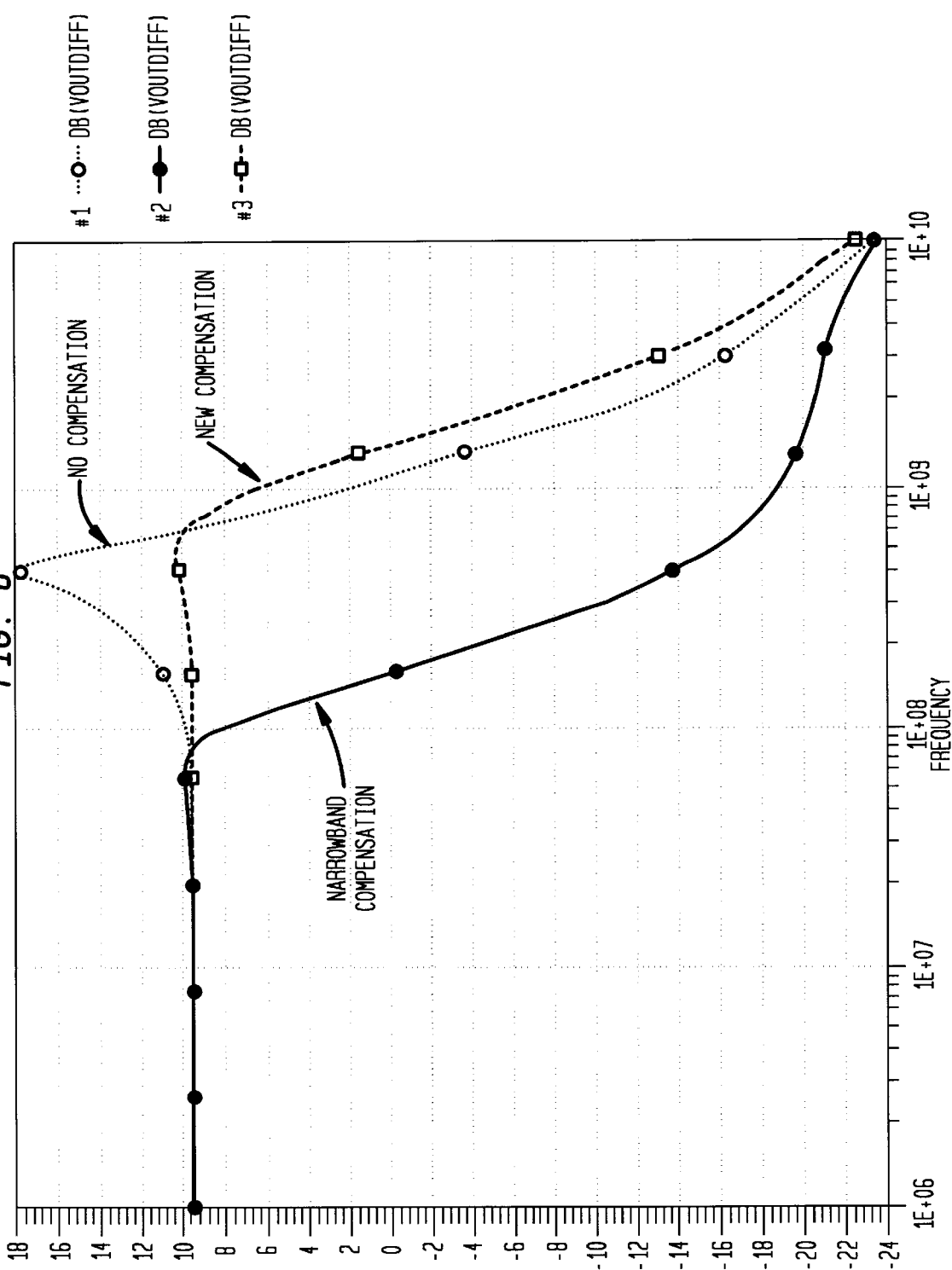
FIG. 6 shows a graphical representation of simulated closed-loop gain curves for non-simplified circuits illustrating operation without compensation, with narrowband compensation, and with resistive pole-splitting compensation according to the present invention.

FIGS. 5a–b shows a graphical representation of simulated open-loop gain and phase response curves for non-simplified circuits illustrating operation without compensation, with narrowband compensation, and with resistive pole-splitting compensation according to the present invention. Similarly, FIG. 6 shows a graphical representation of simulated closed-loop gain curves for nonsimplified circuits illustrating operation without compensation, with narrowband compensation, and with resistive pole-splitting compensation according to the present invention.

Figure 1:
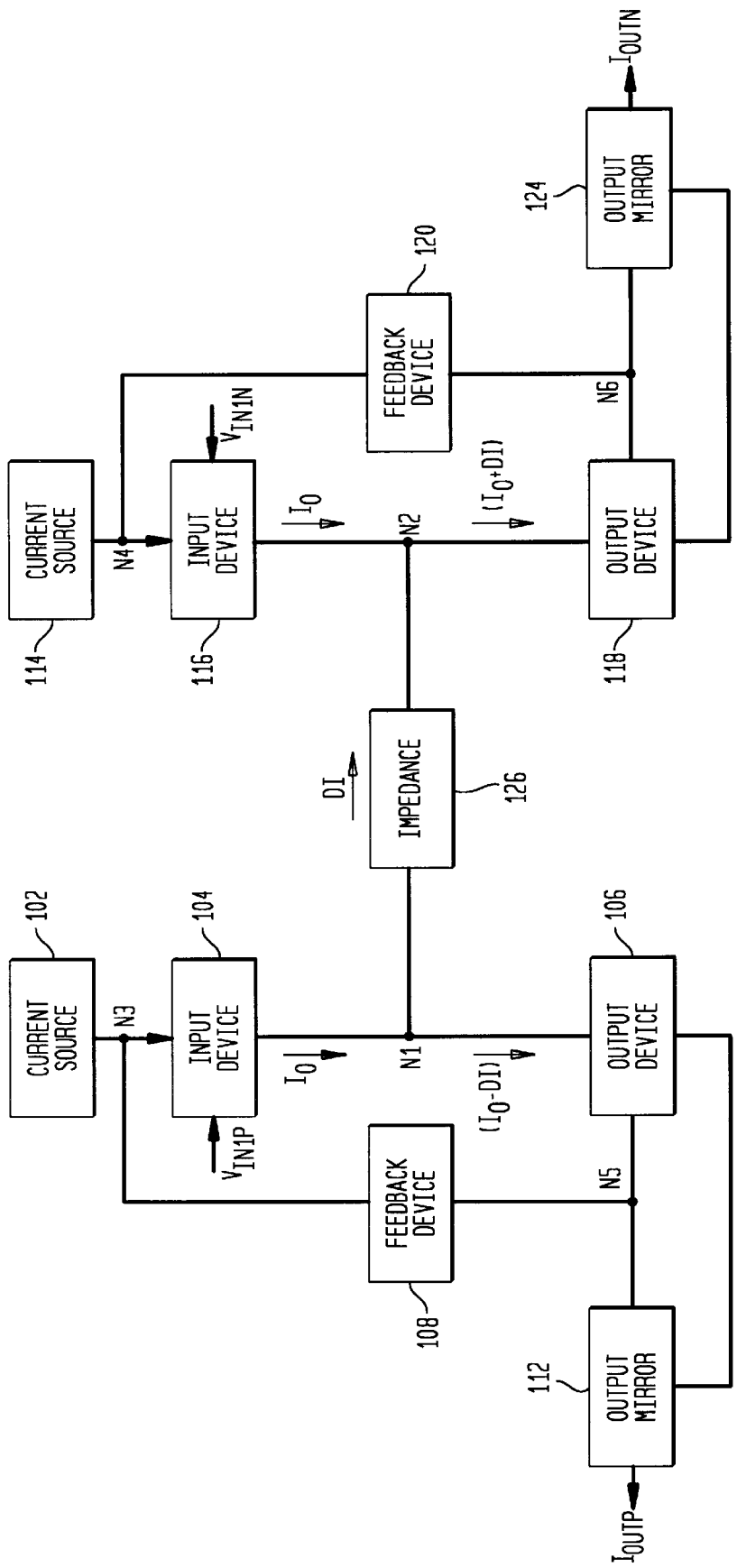
FIG. 1 shows a block diagram of a conventional differential-input transconductance amplifier.

Line #1 of FIG. 5 shows a graphical representation of the open-loop gain of an amplifier similar to amplifier 100 of FIG. 1 to differential input voltages ranging from 1 MHz to 10,000 MHz. As shown in Line #1, the total phase shift is close to 360 degrees (on the plot, 0 degrees corresponds to a 360 degree phase shift) before the gain drops below unity.

This implies a low phase margin for the amplifier. This is manifested as pealing in the closed-loop amplifier response as illustrated in Line #1 of FIG. 6. The gain stays roughly constant at 10 dB from 1 MHz to 100 MHz, at which point the gain rises to a high of about 18 dB at about 500 MHz, at which point the gain begins to fall off fairly rapidly. Such a response at these high frequencies may be undesirable for certain applications.

Figure 4:
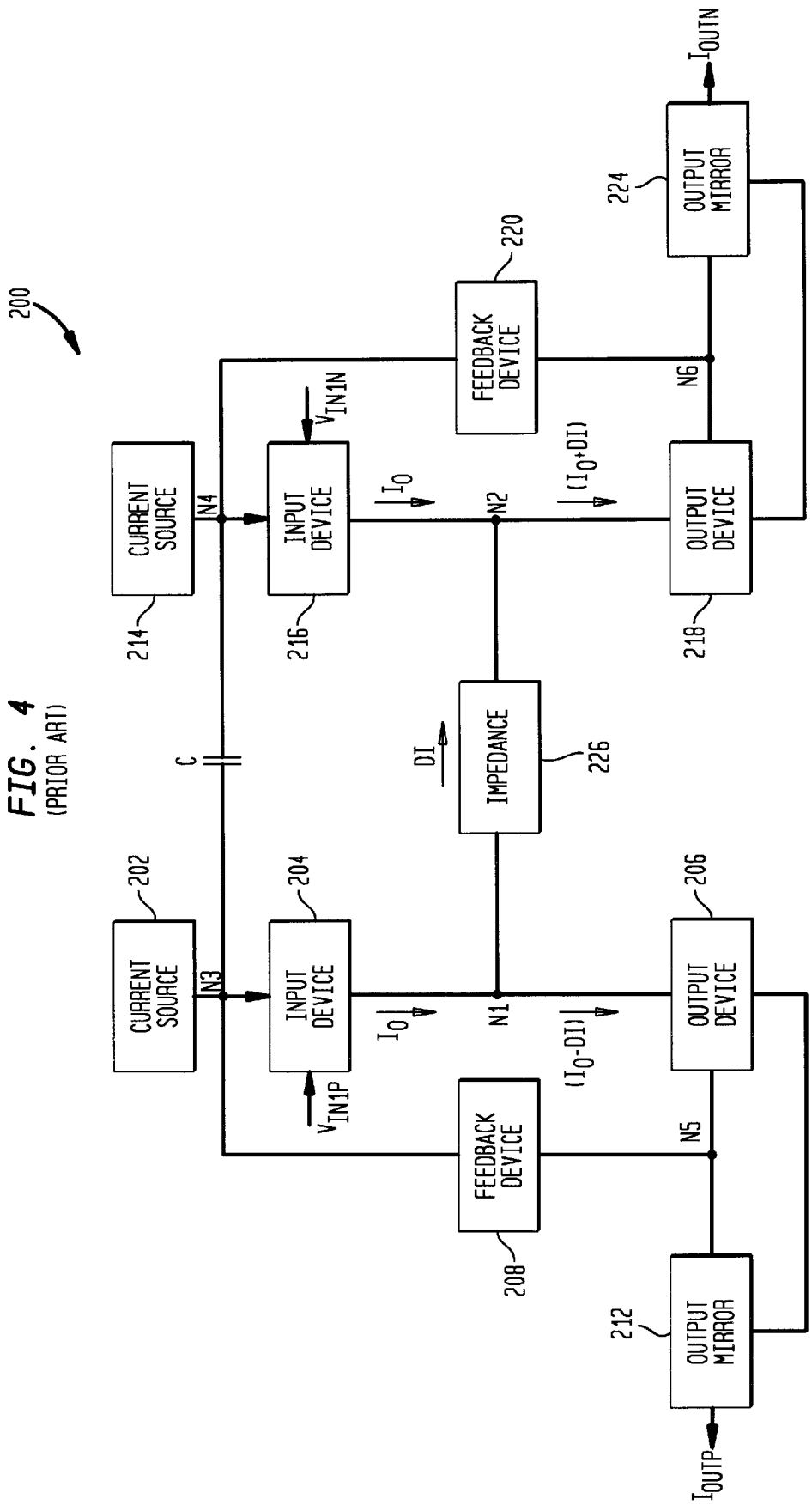
FIG. 4 shows a block diagram of a differential-input transconductance amplifier with narrowband compensation.

Line #2 of FIG. 5 shows the open-loop response of an amplifier with narrowband compensation, such as amplifier 200 of FIG. 4. As shown in Line #2, narrowband compensation reduces the unity-gain frequency to a value where good phase margin can be achieved. As shown in Line #2 of FIG. 6, the narrowband compensation scheme eliminates the region of instability from the closed-loop amplifier response. Unfortunately, this standard compensation scheme also limits the linear operating range of the amplifier to frequencies less than 100 MHz. This too can be undesirable for certain applications of the amplifier.

Line #3 of FIG. 5 shows the open-loop response of an amplifier with resistive pole-splitting compensation according to the present invention. The total phase shift around the loop at the unity-gain frequency is reduced relative to the non-compensated case. This results in improved phase margin. Line #3 of FIG. 6 shows the closed-loop response of an amplifier similar to amplifier 300 of FIG. 7, employing resistive pole-splitting compensation. As shown in Line #3, the amplifier response is relatively constant over a wider range of operating frequencies than either amplifier 100 of FIG. 1 with no compensation or amplifier 200 of FIG. 4 with narrowband compensation. Moreover, amplifier 300 does not exhibit any of the instability associated with amplifier 100. As such, the amplifier has been stabilized without sacrificing bandwidth. In fact, the technique has resulted in a bandwidth higher than that of the corresponding uncompensated amplifier. This simulation confirms the desired movement of the dominant poles. Thus, the present invention can be used to provide stable, linear amplifier operations without loss of bandwidth. The present invention may be especially useful in applications with low power supply voltages, for which other conventional compensation schemes that rely on relatively high voltage levels are inappropriate.

Although, in FIGS. 7–9, the present invention is described in the context of differential-input transconductance amplifiers, it will be understood that the present invention can also be applied to single-input transconductance amplifiers, which essentially correspond to one half of amplifier 300.

In one embodiment of the present invention, devices, such as input devices 304 and 316 of FIG. 7, are implemented using bipolar transistors. In such an embodiment, the input voltages are applied to the bases of the input devices. In alternative embodiments, input devices 304 and 316 may be implemented using other types of transistors, such as MOSFETs or JFETs. In such embodiments, the input voltages are applied to the gates of the input devices. Depending on the implementation, other devices, such as output devices 306 and 318, feedback devices 308 and 320, and output mirrors 312 and 324, can also be implemented using different types of transistors, such as bipolar or field effect transistors.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a transconductance amplifier, the amplifier comprising:
    an active feedback device;
    a passive compensation circuit, connected in parallel with the active feedback device;
    an input transistor adapted to receive at its base/gate an input voltage to the amplifier;
    a current source connected at an output to a channel node of the input tansistor and adapted to maintain an approximately constant current through the input transistor; and
    an output device and output mirror arrangement connected to the input transistor and adapted to generate an output current of the amplifier, wherein the active feedback device and the passive compensation circuit are connected between a base of the output device and the output of the current source.

2. The invention of claim 1, wherein the passive compensation circuit is a resistive pole-splitting compensation circuit.

3. The invention of claim 2, wherein the passive compensation circuit comprises a resistor.

4. The invention of claim 3, wherein the passive compensation circuit further comprises a DC-blocking capacitor connected in series with the resistor.

5. The invention of claim 4, wherein:
    the active feedback device and the passive compensation circuit are adapted to provide the amplifier with compensation to stabilize the amplifier without compromising high-frequency performance and limiting bandwidth; and
    the active feedback device comprises a transistor.

6. The invention of claim 1, wherein the active feedback device and the passive compensation circuit are adapted to provide the amplifier with compensation without limiting bandwidth.

7. The invention of claim 1, wherein the passive compensation circuit is adapted to stabilize the amplifier without compromising high-frequency performance.

8. The invention of claim 1, wherein the active feedback device comprises a transistor.

9. The invention of claim 1, wherein the amplifier is a differential-input transconductance amplifier having two half circuits separated by an impedance device, wherein each half circuit has an active feedback device and a passive compensation circuit.

10. The invention of claim 9, wherein the impedance device is a resistor.

11. The invention of claim 1, wherein the amplifier is a single-input transconductance amplifier.

12. The invention of claim 1, wherein the passive compensation circuit extends the operating bandwidth of the amplifier.

13. The invention of claim 1, wherein:
    the current source comprises one or more transistors in cascade;
    the output device and the output mirror are transistors interconnected at their bases;
    the active feedback device comprises a transistor connected at its channel nodes to the base of the output device and to the output of the current source; and
    the passive compensation circuit comprises a capacitor and a resistor connected in series between the base of the output device and the output of the current source.

14. The invention of claim 14, wherein the active feedback device and the passive compensation circuit are adapted to provide the amplifier with compensation without limiting bandwidth.

15. An integrated circuit having a transconductance amplifier, the amplifier comprising:

an active feedback device;

a passive compensation circuit, connected in parallel with the active feedback device;

an input device adapted to receive an input voltage to the amplifier;

a current source connected to the input device and adapted to maintain an approximately constant current through the input device; and an output device and output mirror arrangement connected to the input device and adapted to generate an output current of the amplifier, wherein the active feedback device and the passive compensation circuit are connected between a base of the output device and the output of the current source, wherein:

the input device is a transistor adapted to receive the input voltage at its base/gate;

the current source comprises one or more transistors in cascade;

the output device and the output mirror are transistors interconnected at their bases;

the active feedback device comprises a transistor connected at its channel nodes to the base of the output device and to the output of the current source; and the passive compensation circuit comprises a capacitor and a resistor connected in series between the base of the output device and the output of the current source.

16. The invention of claim 15, wherein the passive compensation circuit is a resistive pole-splitting compensation circuit.

17. The invention of claim 15, wherein the active feedback device and the passive compensation circuit are adapted to provide the amplifier with compensation to stabilize the amplifier without compromising high-frequency performance and limiting bandwidth.

18. The invention of claim 15, wherein the amplifier is a differential-input transconductance amplifier having two half circuits separated by an impedance device, wherein each half circuit has an active feedback device and a passive compensation circuit, wherein the impedance device is a resistor.

19. The invention of claim 15, wherein the amplifier is a single-input transconductance amplifier.

20. The invention of claim 15, wherein the passive compensation circuit extends the operating bandwidth of the amplifier.

* * * * *